(12) United States Patent
Yeremin et al.

(10) Patent No.: US 6,664,532 B2
(45) Date of Patent: Dec. 16, 2003

(54) METHOD OF PRECISION CALIBRATION OF MAGNIFICATION OF SCANNING MICROSCOPES WITH THE USE OF TEST DIFFRACTION GRATING

(75) Inventors: Dmitriy Yeremin, Dobbs Ferry, NY (US); Arkady Nikitin, Ardsley, NY (US)

(73) Assignee: General Phosphorix LLC, Ardsley, NY (US)

( * ) Notice: Subject to any disclaimer, the term of this patent is extended or adjusted under 35 U.S.C. 154(b) by 277 days.

(21) Appl. No.: 09/923,899

(22) Filed: Aug. 8, 2001

(65) Prior Publication Data

US 2003/0034437 A1 Feb. 20, 2003

(51) Int. Cl.[7] .................................................. H01J 40/14
(52) U.S. Cl. ...................... 250/216; 250/307; 250/311
(58) Field of Search ............................ 250/216, 201.3, 250/234, 306, 307, 309, 310, 311

(56) References Cited

U.S. PATENT DOCUMENTS 6,573,500 B2 * 6/2003 Yeremin et al. ............ 250/307

* cited by examiner

*Primary Examiner*—Kevin Pyo
(74) *Attorney, Agent, or Firm*—I. Zborovsky

(57) ABSTRACT

A method of precision calibration of magnification of scanning microscopes with the use of a test diffraction grating has the steps of positioning an orientation of a test object on a stage of microscope so that strips of a test diffraction grating are perpendicular to a directional on which a calibration is performed, scanning of a selected portion of the test object along axes X and Y; measuring values of a signal S versus coordinates x and y in a plane of scanning and storing said values $S(x, y)$ in a digital form as a two-dimensional digital array; transforming the two-dimensional array of signals $S(x, y)$ into a two-dimensional array $S(u, v)$ by turning of the axes so that a direction of a new axis U is perpendicular to the strips of the grating and a direction of a new axis V coincides with the strips of the grating; line-by-line mathematical processing in a new manner.

4 Claims, 5 Drawing Sheets

Image of a test object.
1- field of view; 2- pixels; 3- strips of the test diffraction grating; u- direction in which magnification of a microscope is to be determined Figure 1. Image of a test object.
1- field of view; 2- pixels; 3- strips of the test diffraction grating; u- direction in which magnification of a microscope is to be determined Figure 2. Initial and new coordinate systems.
1- microscope field of view; 2- strips of test diffraction grating SEM video-signal S(u) from diffraction grating Overlapping procedure. Solid line – S(u) (original), dashed line – copy of S(u),
a – overlapping zone Self-convolution function P(w) calculated from video-signal S(u) shown in Fig 3.

METHOD OF PRECISION CALIBRATION OF MAGNIFICATION OF SCANNING MICROSCOPES WITH THE USE OF TEST DIFFRACTION GRATING

BACKGROUND OF THE INVENTION

The present invention relates to a method of precision calibration of magnification of a scanning microscopes with the use of test diffraction grating.

Methods of precision calibration of a magnification of scanning microscopes with the use of test diffraction gratings are known. In the existing methods a test object is positioned and oriented on a microscope stage, and corresponding part of the test objects is scanned, with subsequent processing of the thusly obtained data. It is believed that the to existing methods can be further improved.

SUMMARY OF THE INVENTION

Accordingly, it is an object of the present invention to provide method of precision calibration of magnification of a scanning microscopes with the use of test diffraction grating.

In keeping with these objects and with others which will become apparent hereinafter, one feature of present invention resides, briefly stated, in a method of precision calibration of magnification of a scanning microscope with the use of test diffraction grating, which includes the steps of positioning and orientation of a test object on a stage of microscope so that strips of a test diffraction grating are perpendicular to a direction on which a calibration is performed, scanning of a selected portion of the test object along axes X and Y; measuring values of a signal S versus coordinates X and Y in a plane of scanning and storing said values S(x, y) in a digital form as a two-dimensional digital array; transforming the two-dimensional array of signals S(x, y) into a two-dimensional array S(u, v) by turning of the axes so that a direction of a new axis U is perpendicular to the strips of the grating and a direction of a new axis V coincides with the strips of the grating; line-by-line mathematical processing of the array S(u, v) including: separation from it of a one-dimensional array-line S(u) which, contains a profile of an image of periodically repeating strips of a test-object; multiplication of the line S(u) by shifting of its copy relative to an original by an integer number of periods, adjustment of a value of the shift for example by the method of least squares in accordance with a criterion of the best coincidence of the overlapping portions of the original and the copy of the line S(u), calculation of average values S(u) in the zone of overlapping as a semisum of values of the original and copy S(u) in each point of the zone; transformation of the multiplied array S(u) into an array P(w) in accordance with the formula $$P(w) = \sum_{j=1}^{N/2} [S(j) * S(j + w)]$$

where N is a number of members in the multiplied array S(u); determination of coordinates $w_1, w_2, w_3, w_4 \ldots$ of successive maximums of the function P(w) wherein $w_4 > w_3 > w_2 > w_1 > 0$; determination of an average period T' of the test grating in pixels for the selected line S(u) in accordance with the formula $$T' = \frac{1}{n-1} \sum_{i=1}^{n-1} (w_{i+1} - w_i)$$

where n is a number of maxima in the function P(w); moving to a next line S(u) with a new value of coordinates v and performing for it the same mathematical processing; performing statistic processing of obtained set of values T' corresponding to various lines v with calculation of an average period $T_{av}$ for all lines and calculating a magnification $M_u$ along the direction u in accordance with the formula $$M_u = \frac{T_{av} \cdot L}{T_o \cdot N},$$

wherein L is width of a medium of the image in direction of calibration, $T_0$ is an independently attested value of a pitch of the test object, N is a number of pixels on a line along the direction u.

When the method is performed in accordance with the present invention, the method is simpler which requires less expense for corresponding programming and it is more accurate than the existing methods.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings

DESCRIPTION OF THE PREFERRED EMBODIMENTS

Figure 1:
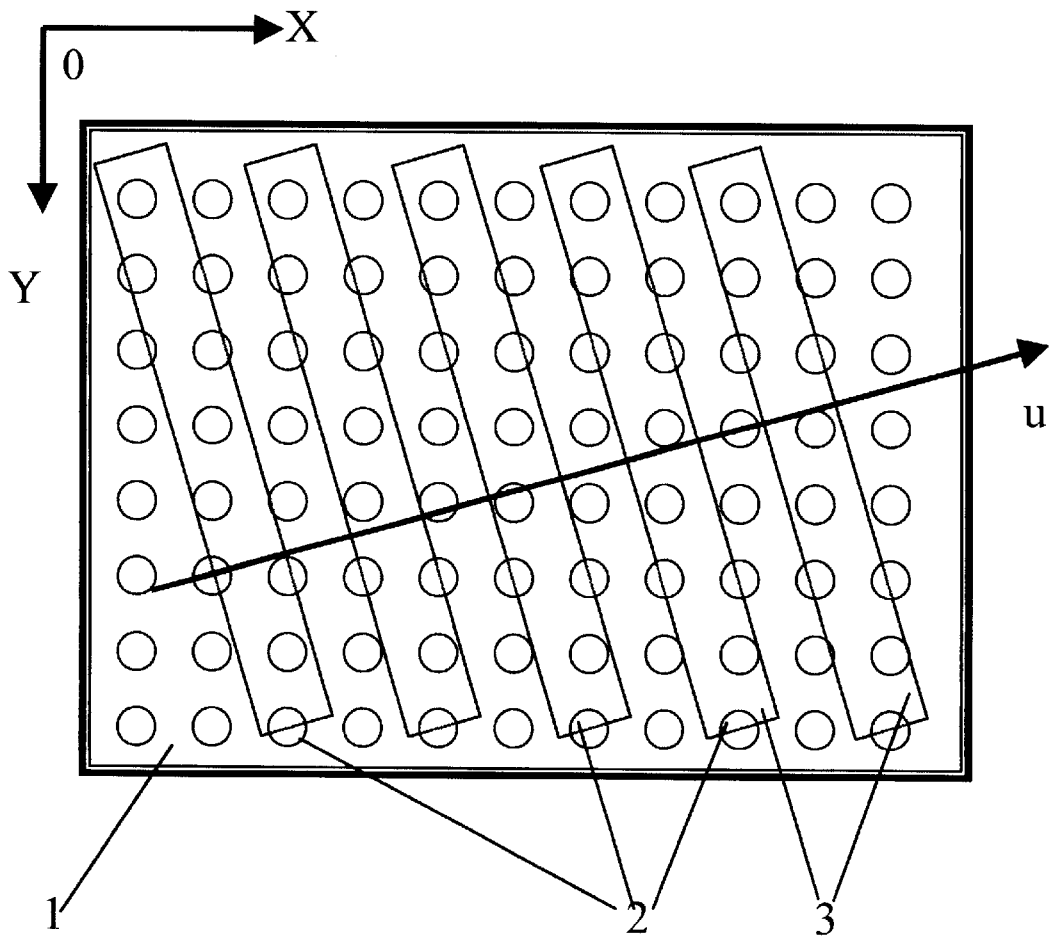
FIG. 1 is a view showing an image of a test object.

In accordance with the present invention a method for precision calibration of a magnification of a scanning microscope is performed with a test diffraction grating. FIG. 1 shows a field of view 1 of a scanning microscope with a plurality of pixels 2 of a signal of scanning with an image of a diffraction grating. The directions of scanning are identified with X and Y and the scanning is performed in accordance with these two perpendicular axes. A magnification calibration of the scanning electron microscope is performed in direction u. As can be seen from this drawing, the test object is positioned and oriented on the microscope stage so that the strips of the test diffraction grating are perpendicular to the direction u of calibration.

Figure 2:
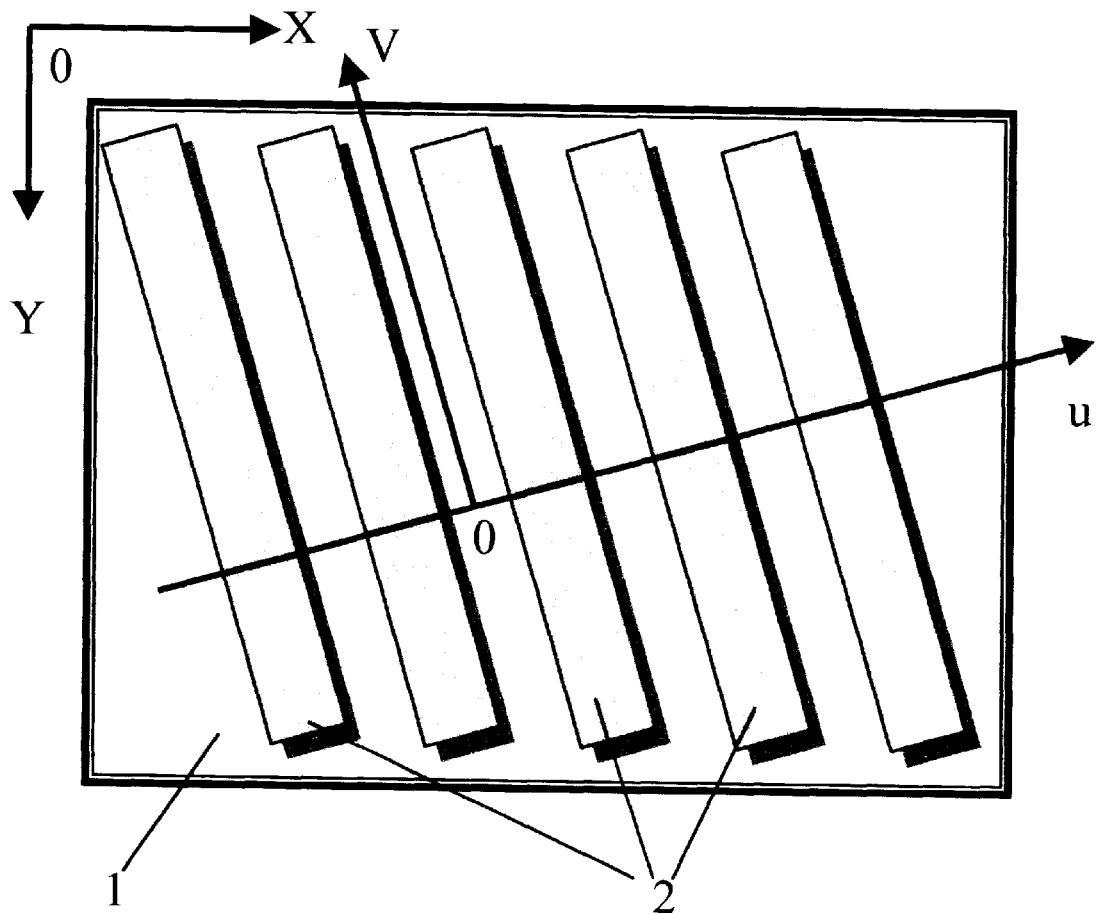
FIG. 2 is a view showing initial and new coordinate systems.
Figure 3:
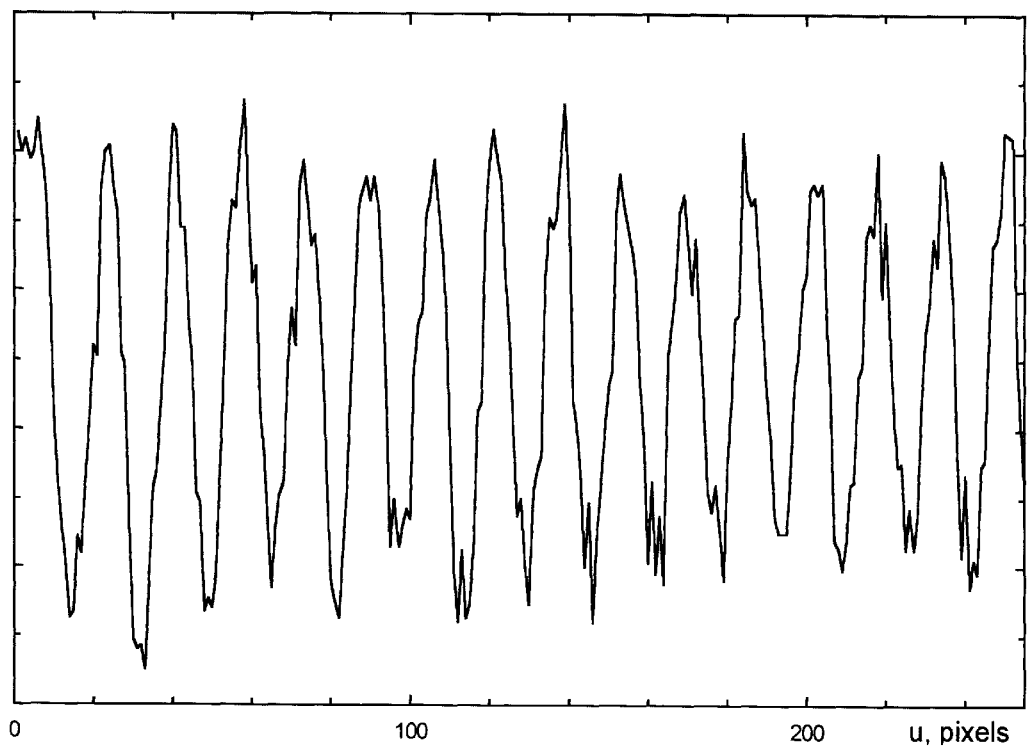
FIG. 3 is a view showing a scan electronic microscope video signal S(u) from a diffraction grating.
Figure 4:
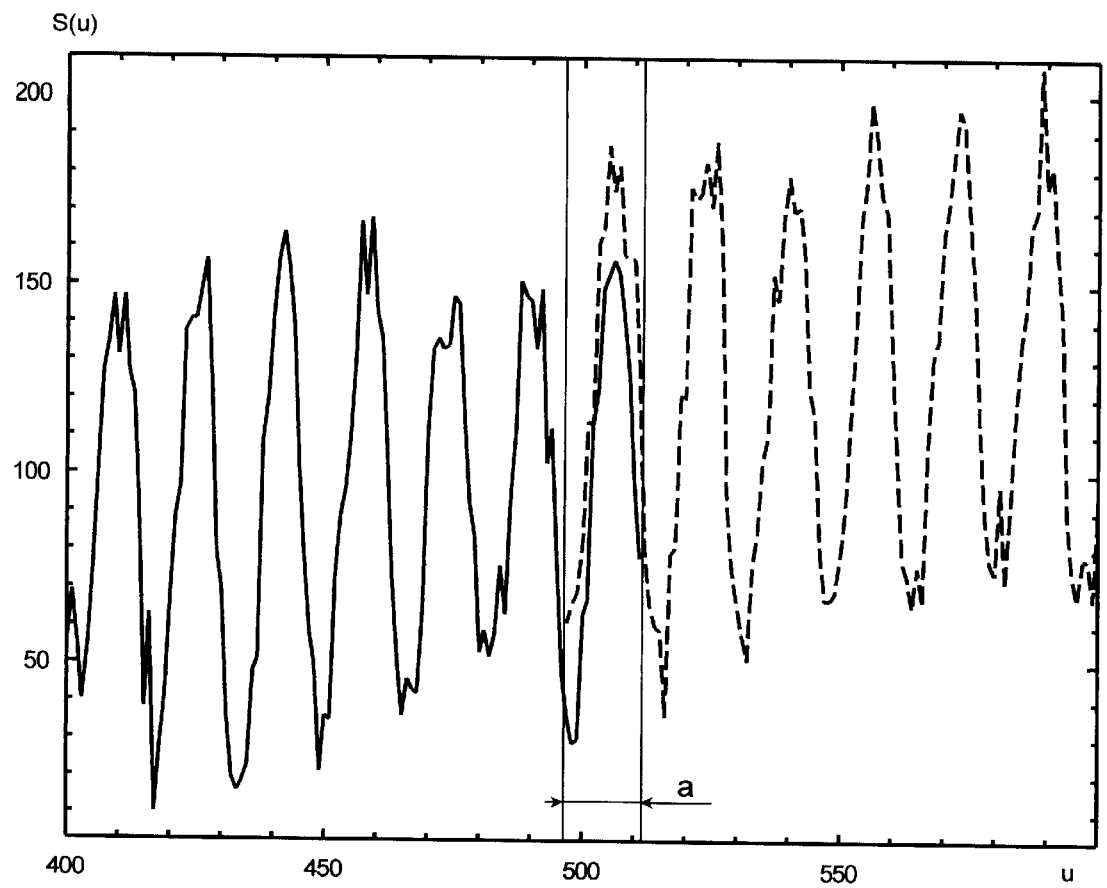
FIG. 4 is a view showing a procedure of overlapping of the line S(u) and its copy; a is the overlapping zone.
Figure 5:
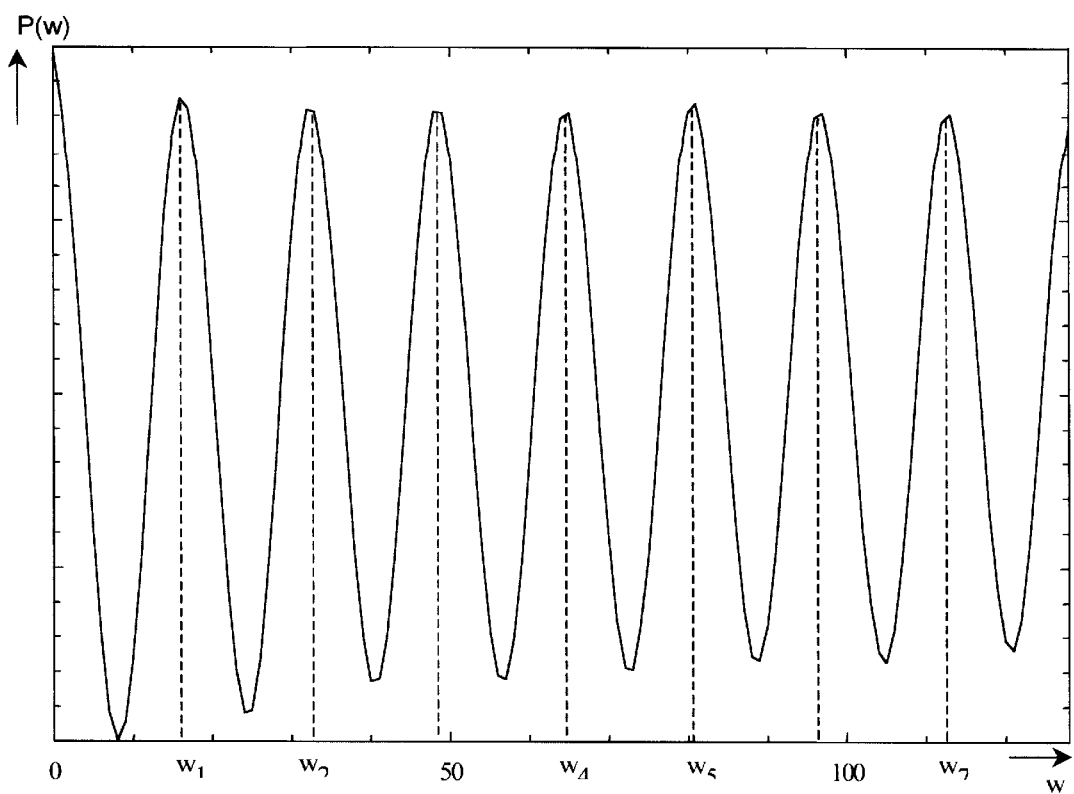
FIG. 5 is a view illustrating a self-convoluting function P(w) calculated from the video signal S(u) shown in FIG. 3.

A portion of the test object which is shown in FIG. 1 is then scanned, and a plurality of values of the signal S in dependence on the coordinates in a plane of scanning are obtained. These values is identified as S(x, y) and they are stored in a digital form as a two-dimensional digital array, for example in a memory of a computer. The thusly obtained two-dimensional array of signal S(x, y) is transformed into a two-dimensional array S(u, v) by turning of the axes, so that a direction of a new axis u is perpendicular to the strips of the grating, and a direction of a new axis v corresponds to the direction of the strips of the grating, as shown in FIG. 2. Thereby a new array of the signal is obtained.

After this a mathematical processing of new array S(u, v) is performed for each line of the new array S(u,v). The mathematical processing includes separation from it of a one-dimensional array-line S(u) which contains a profile of an image of periodically repeating strips of a test-object; multiplication of the line S(u) by shifting of its copy relative to an original by an integer number of periods, adjustment of a value of the shift for example by the method of least squares in accordance with a criterion of the best coincidence of the overlapping portions of the original and the copy of the line S(u), calculation of average values S(u) in the zone of overlapping as a semisum of values of the original and copy S(u) in each point of the zone.

The method further includes transformation of the multiplied array S(u) into an array P(w) in accordance with the formula $$P(w) = \sum_{j=1}^{N/2} [S(j) * S(j + w)]$$

where N is a number of members in the multiplied array S(u); determination of coordinates $w_1, w_2, w_3, w_4 \ldots$ of successive maximums of the function P(w) wherein $w_4 > w_3 > w_2 > w_1 > 0$.

The same mathematical processing is performed for each subsequent line, starting from a next line S(u) with a new value of the coordinate v, with the same above mentioned steps of the processing. Then a standard statistic processing of the set of values T, corresponding to various lines v is performed, with calculation of an average value of the pitch $T_{av}$ along all lines. Then a magnification $M_u$ in the above mentioned selected u is determined in accordance with the formula $$M_u = \frac{T_{av} \cdot L}{T_o \cdot N}$$

wherein L is width of a medium of the image in direction of calibration, $T_0$ is an independently attested value of a pitch of the test object, N is a number of pixels on a line along the direction u.

In accordance with another modification of the present invention it is possible to approximate the calculated function P(w) in the vicinity of each maximum with a suitable analytical curve, and on this analytical curve to localize an extremum with an abscissa considered to be a coordinate $w_i$.

The "cutoff" of each maximum of the function P(w) can be performed in accordance with a preliminarily selected level with formation of an "island", a position of a centroid for the "island" formed during the "cutoff" is calculated, and the coordinate $w_i$ is fixed, as an abscussa of the centroid.

In accordance with the present invention, before the line-by-line mathematical processing of the array S(u, v), operations of noise suppression, averaging and smoothing are performed.

It will be understood that each of the elements described above, or two or more together, may also find a useful application in other types of methods differing from the types described above.

While the invention has been illustrated and described as embodied in simple method of precision calibration of magnification of a scanning microscopes with the use of test diffraction grating, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of precision calibration of magnification of a scanning microscope with the use of test diffraction grating, comprising the steps of positioning and orientation of a test object on a microscope stage so that strips of a test diffraction grating are perpendicular to a direction on which a calibration is performed, scanning of a selected portion of the test object along axes X and Y; measuring values of a signal S versus scanning coordinates X and Y in a plane of scanning and storing said values S(x, y) in a digital form as a two-dimensional digital array; transforming the two-dimensional array of signals S(x, y) into a two dimensional array S(u,v) by turning of the axes so that a direction of a new axis U is perpendicular to the strips of the grating and a direction of a new axis V coincides with the strips of the grating; line-by-line mathematical processing of the array S(u,v) including: separation from it of a one-dimensional array-line S(u) which contains a profile of an image of periodically repeating strips of a test-object; multiplication of the line S(u) by shifting of its copy relative to an original by an integer number of periods, adjustment of a value of the shift by the method of least squares in accordance with a criterion of the best coincidence of the overlapping portions of the original and the copy of the line S(u), calculation of average values S(u) in the zone of overlapping as a semisum of values of the original and copy S(u) in each point of the zone; transformation of the multiplied array S(u) into an array P(w) in accordance with the formula $$P(w) = \sum_{j=1}^{N/2} [S(j) * S(j + w)]$$

where N is a number of members in the multiplied array S(u); determination of coordinates $w_1, w_2, w_3, w_4 \ldots$ of successive maximums of the function P(w) wherein $w_4 > w_3 > w_2 > w_1 > 0$; determination of an average period T' of the test grating in pixels for the selected line S(u) in accordance with the formula $$T' = \frac{1}{n-1} \sum_{i=1}^{n-1} (w_{i+1} - w_i)$$

where n is a number of maxima in the function P(w); moving to a next line S(u) with a new value of coordinates v and performing for it the same line-by-line mathematical processing; performing statistic processing of obtained set of values T' corresponding to various lines v with calculation of an average period $T_{av}$ for all lines and calculating a magnification $M_u$ along the selected direction u in accordance with the formula $$M_u = \frac{T_{av} \cdot L}{T_o \cdot N}$$

wherein L is width of a medium of the image in direction of calibration, $T_0$ is an independently attested value of a pitch of the test object, N is a number of pixels on a line along the direction u.

2. A method as defined in claim 1; and further comprising before the line-by-line mathematical processing, performing at least one operation selected from the group consisting of a noise suppression, an averaging, and a smoothing.

3. A method as defined in claim 1, wherein said determination of coordinates of maximums of the function P(w) includes approximation of the function P(w) in the vicinity of each maximum with a suitable analytical curve, and localizing on said analytical curve an extremum with an abscissa which is taken as a coordinate $w_i$.

4. A method as defined in claim 1, wherein said determination of coordinates of maximums of function of self convolution P(w) includes "cut off" of each maximum of the function P(w) in accordance with a preselected level with a formation of an "island", calculation of a position of centroid for the "island" formed during the "cutoff", and fixing of the coordinate $w_i$ as an abscissa of the centroid.

* * * * *